(12) United States Patent
Honjas

(10) Patent No.: US 11,480,101 B1
(45) Date of Patent: Oct. 25, 2022

(54) WASTE HEAT GATHERING AND TRANSFER SYSTEM AND METHOD

(71) Applicant: William Honjas, Reno, NV (US)

(72) Inventor: William Honjas, Reno, NV (US)

( * ) Notice: Subject to any disclaimer, the term of this patent is extended or adjusted under 35 U.S.C. 154(b) by 0 days.

(21) Appl. No.: 17/151,451

(22) Filed: Jan. 18, 2021

Related U.S. Application Data

(60) Provisional application No. 62/962,230, filed on Jan. 17, 2020.

(51) Int. Cl.
*F02C 1/04* (2006.01)
*F02C 6/14* (2006.01)
*H01L 35/30* (2006.01)

(52) U.S. Cl.
CPC .................. *F02C 1/04* (2013.01); *F02C 6/14* (2013.01); *H01L 35/30* (2013.01)

(58) Field of Classification Search
CPC ...... F02C 1/04; F02C 6/14; F28D 1/00; F28D 1/0408; F01K 11/02; F01K 7/38; F01K 23/101; F28F 9/0246; H01L 35/30
See application file for complete search history.

(56) References Cited

U.S. PATENT DOCUMENTS

| | | | | |
|---|---|---|---|---|
| 3,216,487 A | * | 11/1965 | Gallagher | F28D 19/047 165/9 |
| 3,242,976 A | * | 3/1966 | Morton | F28D 19/04 165/6 |
| 3,962,999 A | * | 6/1976 | Rehm | F22B 37/12 165/71 |
| 4,357,766 A | * | 11/1982 | Croteau | E01H 5/063 37/281 |
| 2003/0029169 A1 | * | 2/2003 | Hanna | F01K 25/08 60/651 |
| 2009/0320477 A1 | * | 12/2009 | Juchymenko | F01K 25/10 60/660 |
| 2010/0066165 A1 | * | 3/2010 | Ganev | H02J 3/38 307/9.1 |
| 2012/0023943 A1 | * | 2/2012 | Freund | F01K 13/02 60/645 |

(Continued)

FOREIGN PATENT DOCUMENTS

WO WO-2018134206 A1 * 7/2018

OTHER PUBLICATIONS

WO-2018134206-A1 English Translation (Year: 2018).*

*Primary Examiner* — Shafiq Mian

(57) ABSTRACT

A waste heat gathering and transfer system and method that, in certain embodiments, includes a collector for collecting at least a portion of waste heat dissipating from one or more waste heat sources, such as equipment surfaces and flames, a heat-to-electricity converter; and an electricity-to-grid transfer interface. In some instances, the system and method also include an electric-to-grid optimizer. In some embodiments, the heat-to-electricity converter is a semiconductor-based converter. In other embodiments, the heat-to-electricity converter is an organic rankine cycle. In some instances, the heat collector includes an external collector layer with an inner and outer surface, an internal collector layer with an internal and external surface, an interior gap area between the external collector layer inner surface and the internal collector layer internal surface, an insulating material, a heat collecting component, and a heat transfer component.

18 Claims, 7 Drawing Sheets

(56) References Cited

U.S. PATENT DOCUMENTS

| | | | |
|---|---|---|---|
| 2014/0277796 A1* | 9/2014 | Peskin | H02J 13/00034 |
| | | | 700/291 |
| 2017/0058714 A1* | 3/2017 | Noureldin | C02F 1/586 |
| 2017/0222437 A1* | 8/2017 | Pratt | H02J 13/00 |
| 2020/0095899 A1* | 3/2020 | Merswolke | F22B 1/16 |

* cited by examiner

WASTE HEAT GATHERING AND TRANSFER SYSTEM AND METHOD

PRIORITY

The present application for patent claims priority through the applicant's prior U.S. provisional patent applications entitled: WASTE HEAT GATHERING AND TRANSFER SYSTEM AND METHOD, application No. 62/962,230, filed Jan. 17, 2020, which provisional application is hereby incorporated by reference in its entirety, provided that if this prior application is in any way inconsistent with the present application (including without limitation any limiting aspects), the present application will prevail.

COPYRIGHT

A portion of the disclosure of this patent document contains or may contain material subject to copyright protection. The copyright owner has no objection to the photocopy reproduction of the patent document or the patent disclosure in exactly the form it appears in the Patent and Trademark Office patent file or records, but otherwise reserves all copyright rights.

FIELD OF TECHNOLOGY

The present disclosure is directed to a waste heat gathering and transfer system and method, and more specifically to a system and method for utilizing heat produced by, for example, a flame, a heat-radiating surface, such as an equipment surface, or other heat source, such heat initially intended for a specific purpose, and transferring the harvested heat for employment for one or more secondary purpose(s), such as, for example, producing electricity, heating, cooling, product treatment, or other applications. Waste heat can include, but is not limited to, for example, heat that is generated by a heat source that is being vented into the atmosphere, radiated away from a heat source, or otherwise under-utilized.

BACKGROUND

Many fields of endeavor involve the consumption of energy. Commonly used energy sources have included electricity and gas purchased from a central energy provider through a network of centrally controlled gas lines or an electric power grid. Major users of energy have included, for example, manufacturers and industrial production facilities which have typically demanded significant amounts of electricity, gas, heated water, and the like, as part of one or more of their production, manufacturing, and business processes. To meet the demand for energy by these users, such as, for example, a manufacturer user, has contracted with a central supplier of energy to provide them with, for example, gas power, electric power, and the like. Due, at least in part, to the typical situation where energy is centrally distributed, processes that require energy typically have incurred additional costs, such as, for example, for the production of hot water. Hot water has often been used as a part of certain industrial processes, and the heating of water with energy provided by a centrally sourced energy supplier often either increased expense, sometimes to the point of being cost prohibitive, was inconvenient to produce, or both.

The cost of centrally produced energy, such as grid energy, has historically been expensive, unpredictable with respect to availability, or both. The price of electricity and gas have regularly increased at varying levels and over varying times, depending on the energy resource. Centrally produced energy price increases have been unpredictable and, at least in part, depended on factors that were out of the control of the energy consumer, such factors including, but not limited to, for example, energy availability, commodity prices, geo-political events, such as war and terrorism, weather, transmission variables, including electric grid and gas pipeline infrastructure and other unpredictable events and variables.

It has been historically difficult to reliably and efficiently store electricity. As a result, the market has had difficulty alleviating price fluctuations, such as, by drawing down reserves. These inconsistencies in electricity supply and demand have sometimes created more frequent or more dramatic price changes. Because of the historical unpredictability of centrally produced energy prices, business, operational and production planning has become a difficult activity with increasing risk to the business.

This unpredictability and typically increasing price of centrally produced energy has, at times caused, at least in part, business uncertainty in energy consumers that has negatively impacted users of such energy. For example, among many other variables, supply and demand has caused, at least in part, significant price fluctuations in the energy market. The price for electricity or natural gas has varied depending on how much buyers have needed and how much the market had available. Factors that have affected the price of energy are complex and the resulting fluctuations have impacted the energy budget of many businesses. Not being able to reliably predict energy costs has made it difficult for users of energy to plan for, for example, the cost of future improvements and purchases, operations, personnel hiring, and business development. As an example, a manufacturer, at times, has assumed increased risk when responding to a Request-For-Proposal (RFP) in a future calendar year lacking knowledge of possible rate increases in energy prices, which often were part of what made the difference between realizing a profit and suffering a loss for the work. Relying on a centrally supplied energy source, users of energy have had little choice but to take risks on the future regarding energy price increases.

The historical unreliability of centrally supplied energy has added another dimension to the cost and inconvenience for energy users. The delivery of centrally supplied power typically relied on the continuous functionality of an integrated grid and pipeline system that was subject to the vagaries of weather, mechanical failure, operational failure, accidents and terrorism and other such variables. Disruptions in delivery of centrally supplied power have sometimes resulted, at least in part, in power outages that negatively impacted energy users productively and economically, sometimes causing, at least in part, personnel, equipment, and projects to idle, sometimes resulting in failure to meet business commitments, such as product manufacturing requirements and deliveries, and other economically harmful consequences.

Reliance on centrally supplied power has, in some cases, contributed, at least in part, to the waste of on-site energy resources, such as the escape and dissipation of used thermal energy. In addition, many energy users engaged in manufacturing and industrial processes typically have not taken into account the energy that might have otherwise been harnessed during the course of their ongoing operations for use with secondary purposes, this lack of accounting resulting in what can be characterized, in some cases, as significant waste of valuable energy resources. Many users of energy, including manufacturers, industrial production facilities and cloud computing facilities have produced heat that escapes to the atmosphere or surrounding environment without being used. As an example, excess heat from industrial sources, such as, for example, flame burners and the surfaces of equipment that the heat from the flames are directed to, have not been harnessed for other uses, such as, for example, production of electricity, heating product, making hot water or other such productive, and in some cases monetizable, uses. As an example, gas burners, commonly used in manufacturing and industry, have typically used, in the more efficient cases, 80% to 85% of the heat they produced efficiently. When a burner reaches the age of seven to eight years, this efficiency typically drops, sometimes substantially, to levels between 50% to 60%, or lower, meaning that up to 50% of the unharnessed heat was wasted as exhaust. Heat that escapes into the environment is "waste heat". The failure to collect and transfer waste heat and direct such waste heat to a secondary use has resulted in one or more of avoidable economic damage, reduced productivity, and damage to the environment.

The historical failure of energy users to harness on-site waste energy resources to produce energy independent of central energy suppliers has often resulted in economic loss on behalf of both energy users and central suppliers. Central energy suppliers have found it economically and physically difficult to build and maintain energy production and transmission facilities and grids to service energy users. Fluctuations in energy fuel and production have vexed central suppliers, as energy users' behaviors became unpredictable in response, causing unpredictability in the revenues to the suppliers necessary to engage in maintenance and planning activities. The vulnerability relying on centrally distributed energy infrastructure, including pipelines and power grids, has increased the probability that large swaths of energy customers will be out of service intermittently, resulting in increased costs and business disruption concerns for one or more of the central supplier, the energy consumer, and government.

There are existing and well understood systems and methods for gathering and storing heat using thermoelectric semiconductors and tubing systems, but these systems and methods have not typically provided for a way to collect heat from non-conventional heat sources, thus eliminating a large part of manufacturing and industrial use of waste heat. The current systems and methods typically involve harnessing waste heat from constant, or non-intermittent, heat sources. As a result, energy users that have employed intermittent heat sources have typically had difficulty independently harnessing the energy generated by the intermittent the heat source. Where unable to harvest heat from the intermittent heat source, the energy user is typically unable to easily convert the heat into energy, often causing them to rely, at least in part, on the expensive, unreliable, inconvenient, and inefficient centrally supplied energy.

Further, current technologies and approaches for collecting waste heat from non-traditional heat sources, do not include effective or efficient methods for collecting waste heat from non-traditional heat sources, such as, for example, cylindrical surfaces, rotating equipment surfaces, and the like, such as those that are heated by burner flames, and from the areas encircling burner flames. As a result, in many cases the heat emitted by these non-traditional heat sources has escaped as waste heat. Being unable to effectively harvest heat from non-traditional heat sources, the energy user was therefore unable to convert the heat into monetizable or reusable energy, causing them, at least in part, to rely on the expense, unreliability, inconvenience, and inefficiency of centrally supplied energy.

Further, to the extent the existing technologies have failed to provide an easily integrated way to store and convert energy generated from intermittent and non-traditional heat sources, users of equipment characterized as intermittent and non-traditional heat sources have been, at least to a degree, disincentivized to utilize waste heat emitted by these intermittent and non-traditional sources to create energy. Being unable to convert and store energy generated from intermittent and non-traditional heat sources has caused and encouraged, at least in part, users of these heat sources to rely on the expensive, unreliable, inconvenient, and inefficient centrally supplied energy.

The conventional technologies and approaches have typically not included a way to use, transmit, and regulate energy generated at the location of an industrial facilities for on-site use, or to otherwise transmit or sell, unused energy to the central energy distributor or other energy consumers via, for example, a power grid interface, or electric grid optimizer. As a result, in some cases, energy users that have had waste heat to convert to power have not been able to sell, or net-meter, the unused portion of the power they generate to the central power provider or other energy consumers and therefore have not realized the economic benefit from the power they generate or could have generated.

Traditional technology and approaches have not provided for power generated by an Organic Rankine Cycle (ORC) generator to simply and easily interface with the grid operated by the central energy supplier. ORC generators are based on the principle used in power plants: water is heated and evaporated into steam. The steam drives a turbine, which connects to a generator to produce electricity. The working principle of the Organic Rankine Cycle is the same as that of the Rankine Cycle: working fluid is pumped to boiler where it is evaporated, passed through an expansion device (screw, tubing or similar applicable device), and then passes through a condenser heat exchanger where it is re-condensed to produce power. The limitations of conventional technologies and approaches have sometimes rendered ORC generated power impractical for integration with waste heat usage projects at manufacturing and industrial projects.

The traditional technologies and approaches typically do not include a method for heat collection, power generation, storage, and transmission using waste heat gathered from intermittent (and sometimes non-intermittent), non-traditional, heat sources. Due, at least in part, to a lack of the availability of such a method, energy users that employ intermittent (and sometimes non-intermittent), non-traditional, heat sources have resulted in users of these heat sources relying on the expense, unreliability, inconvenience, and inefficiency of centrally supplied energy. In addition, users that have employed these heat sources have often not been able to harvest heat for purposes related to their manufacturing or industrial production businesses such as, for example, heating water, pre-heating product, drying, and other such functions that require heat and energy, resulting in non-realized cost, production and operational benefits.

SUMMARY

The present disclosure relates to the systems and methods for producing one or more of dispersed, independent, and efficient power generation using a constant or an intermittent, heat source that facilitates one or more of the collection of waste heat, the conversion of waste heat to electricity, the storage of the converted heat-to-electricity the transmission of the heat or the electricity, the reuse of at least a portion of the waste heat, and the use of the resulting energy generated on-site, including, in some instances, for export to a one or more of a centrally controlled macrogrid, a microgrid, or energy consumer directly. In some instances, the heat produced on-site is then used to avoid, at least in part, reliance on centrally produced energy suppliers, which can reduce dependence on one or more of expensive, unreliable, inconvenient, and inefficient energy sources.

In some embodiments, independent and efficient power generation using the waste heat gathering and transfer system and method with a non-constant, or intermittent, heat source facilitates the storage, transmission, and use of the resulting energy, thus generated on-site or for export to a centrally controlled macrogrid, a microgrid, or energy consumer directly. In some embodiments, one or more technologies or processes as disclosed herein are implemented at an asphalt production facility. Such embodiment uses heat from one or more intermittent heat sources, such as, for example, an intermittently fired burner flame used for the primary purpose of heating, de-moisturizing, and mixing aggregate and oil to make asphalt within a rotating drum dryer. In some instances, the burner is turned on and off, intermittently, as product demand dictates.

In some instances, the waste heat gathering transfer system and method includes a collector for gathering waste heat from one or more heat sources, such as non-conventional or intermittent heat sources, where such sources can include a flame, such as a burner flame, and heated equipment surfaces, such as those of a rotating cylinder, such as a drum dryer at an asphalt plant. In some embodiments, the waste heat gathering transfer system and method can be used to gather heat form residential heat sources, commercial heat sources, or both.

In some instances, burner flames generate heat in sufficient quantity to satisfy a primary purpose for which the heat source is being produced, which in the case of an asphalt production plant as an example, is heating aggregate and oil to mix asphalt in a drum dryer. These burners typically use, in the case of efficient use, 80% to 85% of the heat they produce, but in many cases being less efficient and below those percentages. Absent a heat harvesting apparatus, such as the collector component of the waste heat gathering transfer system and method, the heat produced by flames discharged into equipment to produce industrial products transfer to and heats equipment surfaces and then escapes from equipment surfaces, producing additional waste heat.

In some embodiments involving a drum dryer, the collector is positioned in a stationary state, axially to a line extending from the center the burner flame through the center of the rotating cylindric or semi-cylindrical drum dryer, or in the cases where the collector components are not embedded within a collector housing, radially about the center, or axis, of the burner flame, the rotating drum dryer cylinder, or both, in both cases on a support structure. In some embodiments the collector includes one or more of an external collector layer with an inner and outer surface, an internal collector layer with an internal and external surface, an interior gap area, one or more insulating materials, one or more heat collector components, and one or more heat transfer components.

In some embodiments, the collector includes one or more heat-to-electric semiconductor-based collector components, such as thermodynamic heat sensors or similar technology. In some embodiments, the collector includes one or more heat collector tubes made of a thermally conductive material, such as, for example, steel, filled with heat convective working fluid, such as, for example, water, which working fluid flows through the heat collector tubes, absorbing the heat transferred from the heat collector tubes. In some instances, shell or tube heat exchangers are used, such shell or tube varying in geometry and configuration to accommodate the energy source and the total thermal input.

In some embodiments, the heat harvested by the collector is converted to electricity by the semiconductor-based heat collector component, then transferred to an electricity-to-grid storage and transfer interface, such as a lithium-ion based energy storage or similar appropriate devices, where the energy thus stored is distributed by an electric distribution optimizer to one or more of the facility generating the heat, the central power macrogrid, a microgrid, or another energy consumer directly.

In some implementations, the heat is harvested by collector tubes filled with working fluid, the working fluid being circulated in a complete closed loop or partial loop circulation system with, for example, an Organic Rankine Cycle power generation facility (ORC) that functions as a heat-to-electricity conversion system. ORC generators are based on the principle used in power plants, where water is heated and evaporated into steam. The steam drives a turbine, which connects to a generator to produce electricity. The working principle of the ORC is the same as that of the Rankine Cycle. In some embodiments, the working fluid is circulated into one or more collector components where it is heated and at least partially evaporated and circulated to the ORC generator which includes the working fluid passing through an expansion device, such as, for example, a screw, tubing, or similar applicable component or structure, and then passes through a condenser heat exchanger where it is recondensed to produce electric power.

In some embodiments, the electricity thus generated by one or more collectors is then transferred to an electricity-to-grid transfer interface, such as, for example, an electricity-to-grid transfer interface composed of lithium-ion based energy storage or similar devices, where the energy thus stored is distributed by the electric distribution optimizer to one or more of the facility generating the heat, the central power macrogrid, a microgrid, or another energy consumer directly. Once the working fluid is run through the ORC generator, the heat remaining in the fluid can be used for other purposes before recirculating to the collector, such as, for example, pre-heating and de-moisturizing aggregate for use at an asphalt plant, or other functions and activities related to the processes of the industrial and manufacturing facilities producing the heat.

In some embodiment, the electric distribution optimizer includes an integrated relay- and controller-based system for balancing distribution of converted and stored electricity designed, at least in part, to maintain balance, stability, or both, of the destination power receiver that the invention is interfaced with, and for use at the facility generating the heat harvested by the collectors, such as an asphalt plant. In some instances, the electric distribution optimizer maintains independent or partially independent power production at the facility generating the heat in a microgrid ("island") mode, or distributes power via compatible connection to and synchronous with the traditional wide area synchronous grid (macrogrid) operated by, for example, a central energy supplier. In some instances, the electric grid optimizer will allow disconnect to "island mode" allowing the facility generating the heat to function autonomously or semi-autonomously based, at least in part, on physical and economic conditions to the facility generating the heat, while allowing unused or excess converted and stored power to be directed toward the power destination, to which, the waste heat gathering and transfer system is connected.

The waste heat gathering and transfer system can provide energy users with the ability use waste heat from one or more non-conventional heat sources including one or more of intermittent heat sources, moving heat sources, rotating heat sources, and oddly-shaped heat sources, to harvest waste heat that would otherwise go unused, to independently produce power, recycle heat, or both, resulting in one or more of reduced energy costs, increase power supply reliability, and increased revenue, such as by selling or net-metering excess power production to central energy suppliers interfaced with the waste heat gathering and transfer system and method.

In some implementations, collectors with one or more integrated heat-to-electric semiconductors can provide a reliable, environmentally friendly, and economically viable way to recycle waste heat. Collectors can be scaled to variable sizes and shapes related, in part, to non-conventional heat sources that would otherwise not be used to achieve independent power generation. This can result in one or more of reducing energy costs, increasing the reliability of power supply, and increasing revenue by selling or net-metering excess power production to central energy suppliers interfaced with the waste heat gathering and transfer system and method.

In some embodiments, collectors with integrated tubes filled with working fluid can provide for independent power generation and also provides hot fluids for related industrial and manufacturing processes, such as, for example, space heating, product heating, de-moisturizing, treating product, and other uses related to industrial and manufacturing processes at the facility producing the heat. This can increase efficiencies related to one or more of operation and production, a reduction in energy costs, increased reliability of power supply, and increase revenue by selling or net-metering excess power production to central energy suppliers interfaced with the waste heat gathering and transfer system and method.

In some instances, the electricity-to-grid translator interface provides for storage of heat-to-electric, for example, semiconductors, or heat-to-working fluids-to-electric, for example, tubes, power resulting in a constant or near-constant power source or "evening out" of power produced from intermittent heat sources that would otherwise go unused, and can include an economic and timely connectivity to macrogrids operated by central energy suppliers. The waste heat gathering and transfer system interfaces the heat-to-electric power generated by ORC generators with the electricity-to-grid translator, resulting in power produced by an ORC generator being easily approved for use on macrogrids. This can result in cost savings, both in terms of construction and by permitting the use of waste heat power generated by ORC engines.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

SPECIFICATION

The applicant believes that it has discovered at least one or more of the problems and issues with systems and methods noted above as well as advantages variously provided by differing embodiments of the waste heat gathering and transfer system and method disclosed in this specification.

Briefly and in general terms, the present disclosure provides for improved waste heat collection, transfer, conversion-to-energy, storage, and use, and more particularly, to improved collection, transfer, conversion, and use of waste heat from non-traditional heat sources, intermittent heat sources, or both.

Figure 1:
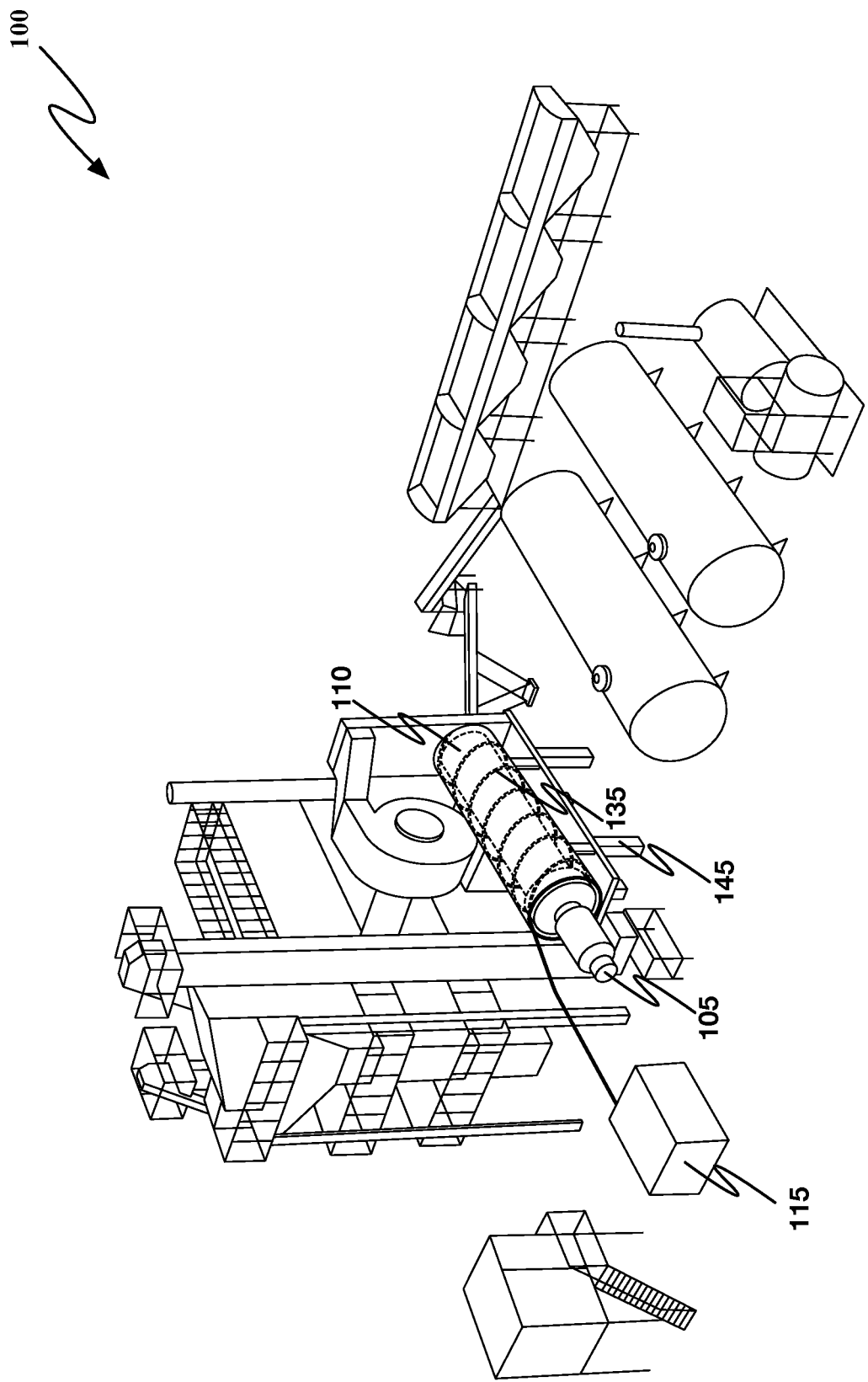
FIG. 1 is a perspective view of the waste heat gathering and transfer system and method implemented at an asphalt production plant.

Referring to FIG. 1, in some embodiments, the waste heat gathering and transfer system and method is implemented at an asphalt production facility 100. Waste heat can be gathered by a collector 135 mounted to a support structure 145 from a burner flame generated by, for example, a gas burner 105, equipment surfaces, such as a drum dryer surface 110, said drum dryer used intermittently to one or more of heat, de-moisturize, and mix aggregate and oil to as part of an asphalt production process, and converted to electricity, such as through transfer to an Organic Rankine Cycle system 115. The gas burner 105 is typically intermittently engaged based, at least in part, on product demand. Although an asphalt plant is shown, a person having ordinary skill in the art will appreciate that the technology and approaches disclosed herein can be applied to other plants and facilities, such as those engaged in manufacturing and industrial activities that generate heat, including intermittent heat sources.

Figure 2:
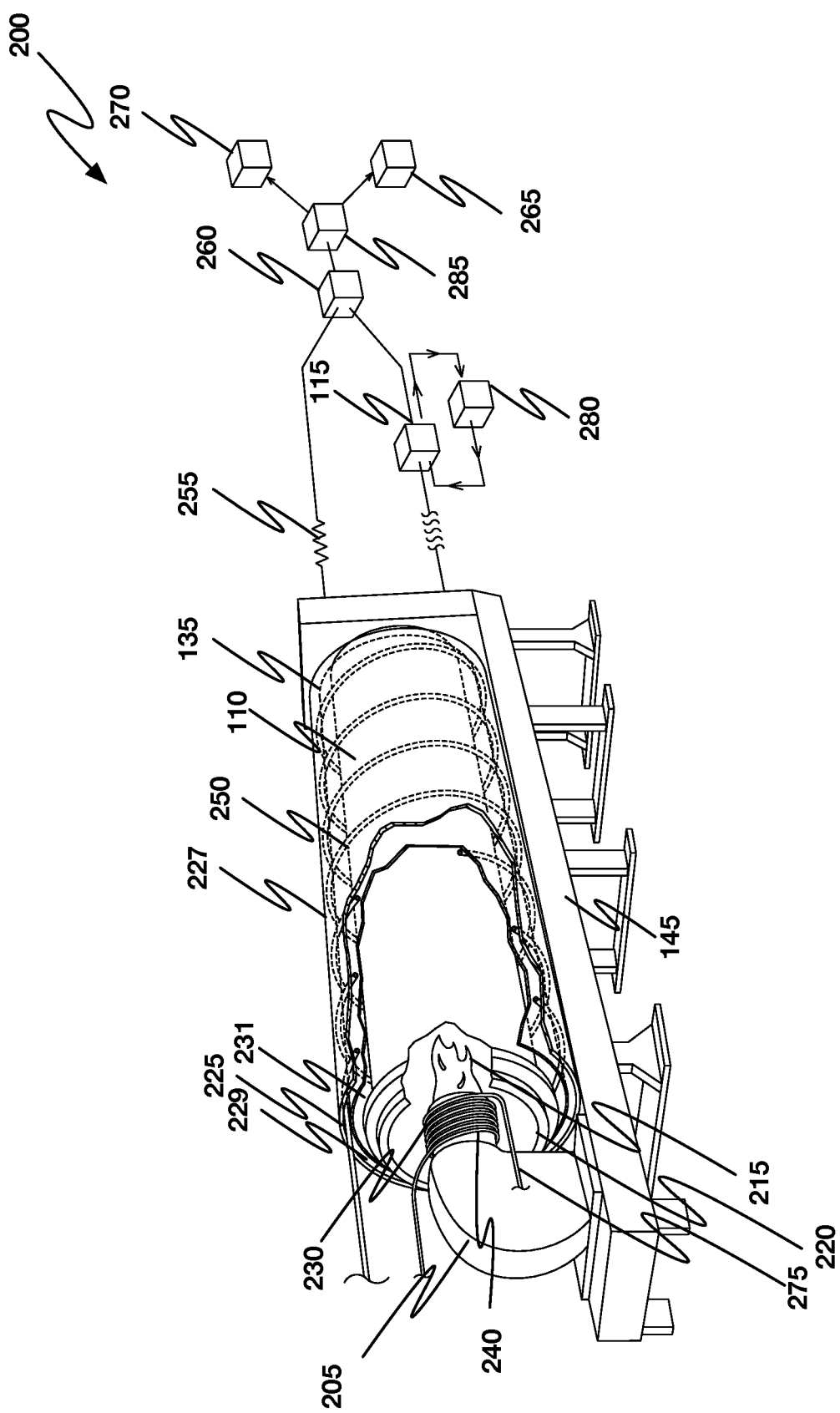
FIG. 2 is a side perspective view of the collector with enclosed tubular heat collection components of the waste heat gathering and transfer system and method of FIG. 1.

Referring now to FIG. 2, in some instances of a waste heat gathering and transfer system 200, the burner 205 generates heat in a quantity sufficient to satisfy the primary purpose for which the heat source is being produced, such as heating aggregate and oil to mix asphalt in the rotating drum dryer 110. In some instances, the gas burner 205 produces a high BTU flame, such as, for example, a 580/126 Million BTU flame 215. In the case of asphalt production, the primary purpose of the flame 215 is to heat the aggregate and oil to sufficient temperature to produce asphalt within the drum dryer 110. In the case of highly efficient plants, gas burners 205 use 80% to 85% of the heat produced efficiently, although in many cases the use percentage is lower, and sometimes significantly lower.

The gas burner flame 215 discharges into a rotating dryer drum 110 which in the case of some asphalt plants, exceeds 30 feet in length and 9 feet in diameter, but can otherwise vary based on the manufacturing or industrial application. The burner flame 215 may be placed external to the drum dryer 110, partially internal to the drum dryer 110, or fully internal to the drum dryer 110. As a result of the flame 215 being discharged into the drum dryer 110, the drum dryer 110 absorbs an amount of heat, typically transferring an amount of that heat from the internal surface drum dryer 220 to the external surface of the drum dryer 225. Heat escaping from the external surface of the drum dryer 225 produces waste heat the can be collected and converted into energy.

In some embodiments, the flame 215, the drum dryer 110, or both produce high heat volumes of high temperature-grade waste heat. In some instances, at asphalt plants, temperatures along the external surface of the drum dryer 225 are particularly hot proximal to the burner 205, sometimes exceeding 600° F. and sometimes maintaining an average temperature of about 500° F. along its length, even in the case of intermittent engagement of the burner flame 215.

In some embodiments, one or more collectors 230, 135 are positioned axially to a line extending from the center the burner flame 215 through the center of the rotating cylindric drum dryer 110. In some embodiment, a heat collector is mounted stationary in front of a burner heat shield 240 on the side facing the gas flame 215. In some embodiments, the drum dryer heat collector 135 is stationary mounted on a support structure 145. The drum dyer collector 135 is installed so as not to contact the drum dryer 110 such that the drum dryer 110 can rotate freely and perform its intended function. In some embodiments, the drum dryer heat collector 135 at least partially encapsulates the drum dryer 110.

In some embodiments, the external collector layer 225 of the collector 135 includes an outer surface 227 distal to the heat source, and such outer surface can include, for example, steel. In some implementations, the internal surface 229 of the external collector layer 225 overlays insulation material that, at least in part, assists in retaking heat internal to the collector. The collector 135 can be constructed of heat conductive material, such as, for example, steel or similar material, a vitreous glass, plastic, or the like. In some instances, a layer bonded to the internal collector layer internal surface proximal to the heat source 231 to assist in the prevention of one or more of rusting, damage to the collector, damage to the semi-conductors, damage to the tubing, or damage to other elements or components contained within the collector. In some embodiments, the collector includes one or more of internal heat-conductive materials proximal to the heat source and heat insulating material on the external surface distal to the heat source 227, in some instances, to at least in, part, contain and protect one or more heat gathering components, such as the semiconductor (e.g., see FIG. 4 at 405) or tubing heat gathering components 250. In some instances, the outer layer of the collector 225 overlays insulation material that holds heat internal to the collector 135, while the internal surface of the internal layer 231 of the collector proximal to the flame is made of high-quality conductive material, such as steel or similar material, a vitreous glass or plastic, or similar material, layer bonded to the inside surface to prevent rusting. In some embodiments, the external collector layer outer surface 227 comprises at least one maintenance access panel for accessing the heat gathering components 250, 405.

Figure 3:
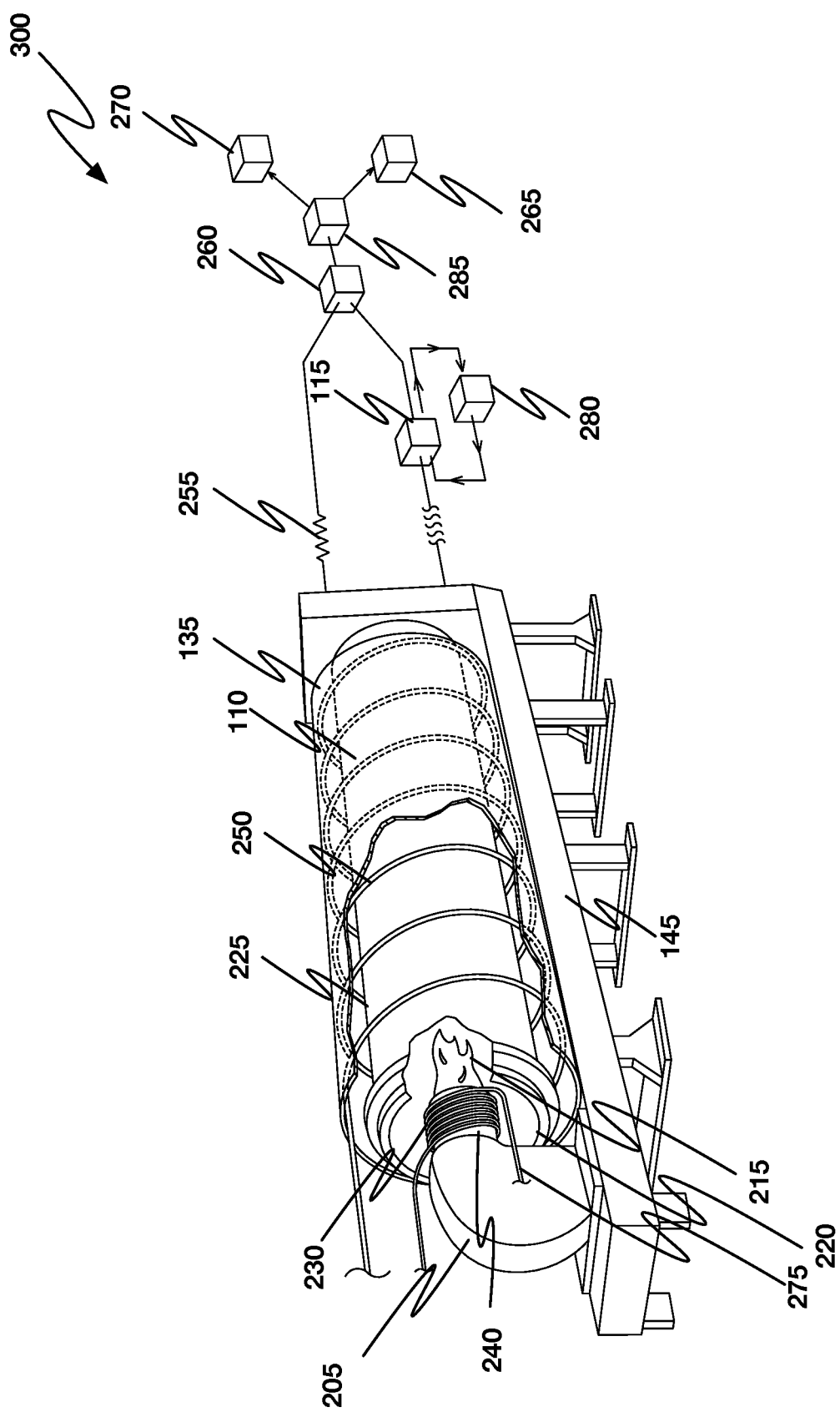
FIG. 3 is a side perspective view of the collector with exposed tubular heat collection components of the waste heat gathering and transfer system and method of FIG. 1.

Referring now to FIG. 3, in some embodiments in some instances of a waste heat gathering and transfer system 300, one or more heat collector components, such as tubes 250, are at least partially exposed to direct heat radiating from the equipment surface, such as the dryer drum 110.

Figure 4:
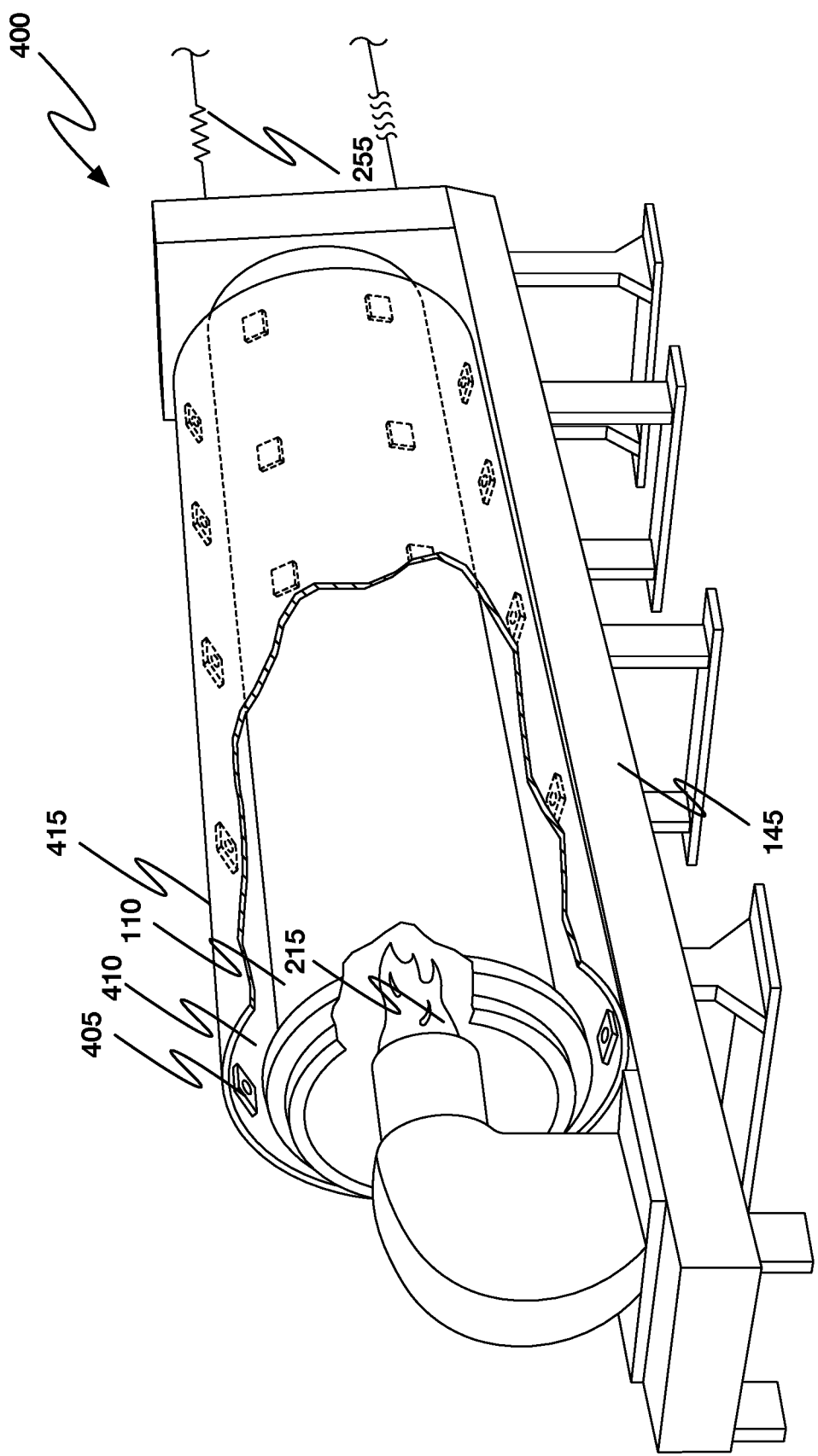
FIG. 4 is a side perspective view of the collector with semiconductor-based heat collection components of the waste heat gathering and transfer system and method of FIG. 1.

Referring now to FIG. 4, in some embodiments of a waste heat gathering and transfer system 400, semiconductor-based heat collectors 405 are mounted and housed in the collector 415 between the inner layer of the collector 410 and the outer layer of the connector 415. In some instances, the semiconductor-based heat collectors 405 are heat-to-electric converters and are fully enclosed within the collector layers 410, 415. In other embodiments, one or more of the semiconductor-based heat collectors are enclosed within the collector layers 410, 415. In some instances, the heat-to-electric semiconductors converters include thermodynamic heat sensors.

In some embodiments, waste heat is emitted from the gas flame 215, the surface of the rotating drum dryer 110, or both and captured by the collectors, which includes semiconducting heat-to-electric sensors 405, tubing heat gathering components 230, or both. With respect to the semiconducting heat-to-electric sensors 405, in some instances, a sensor within the semiconductor detects a heat signal and passes the signal to a modifier within the semiconductor, making up the first part of the semiconductor's internal heat measurement system. This transmits the modified heat signal to the output transducer. The output transducer emits the final signal in the form of electric output.

The semiconductors are traditionally made of silicon, or other similar materials, such as members of groups III to V, to the extent such materials are readily available, easily used, have appropriate physical characteristics, and are cost-effective. Once waste heat is converted to electric energy via the semiconducting heat-to-electric sensors 405 the electric power is transferred 255 to an electricity-to-grid transfer interface 260, such as a grid interfacing battery technology, using, for example, aluminum wire with a steel core, or other materials with similar properties, for storage and transfer for use at the facility using the electricity 265 or an external power destination 270, such as a macrogrid, a microgrid, or another energy consumer directly.

Figure 5:
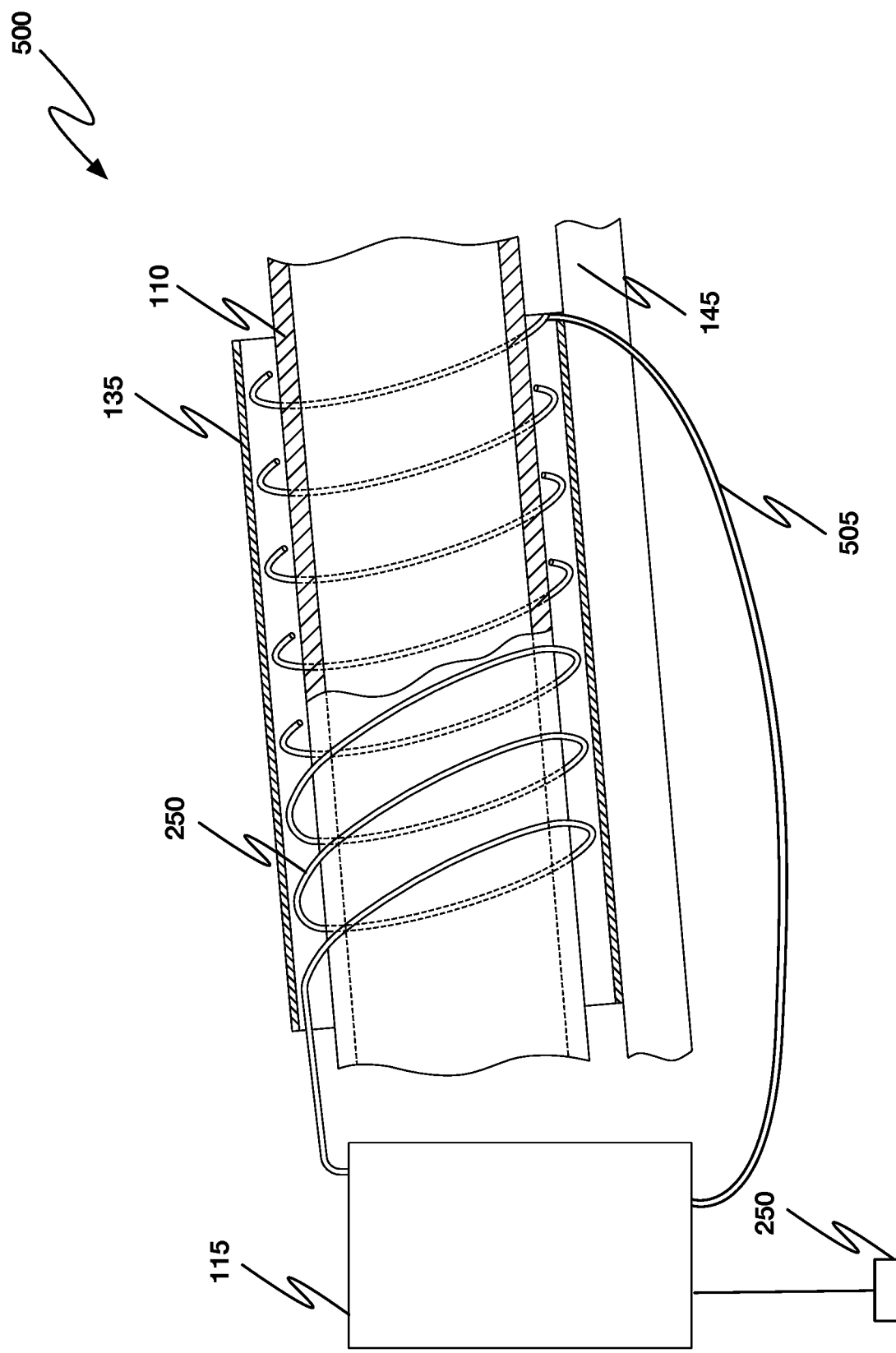
FIG. 5 is a partial cross section side view of the collector of FIG. 3.
Figure 6:
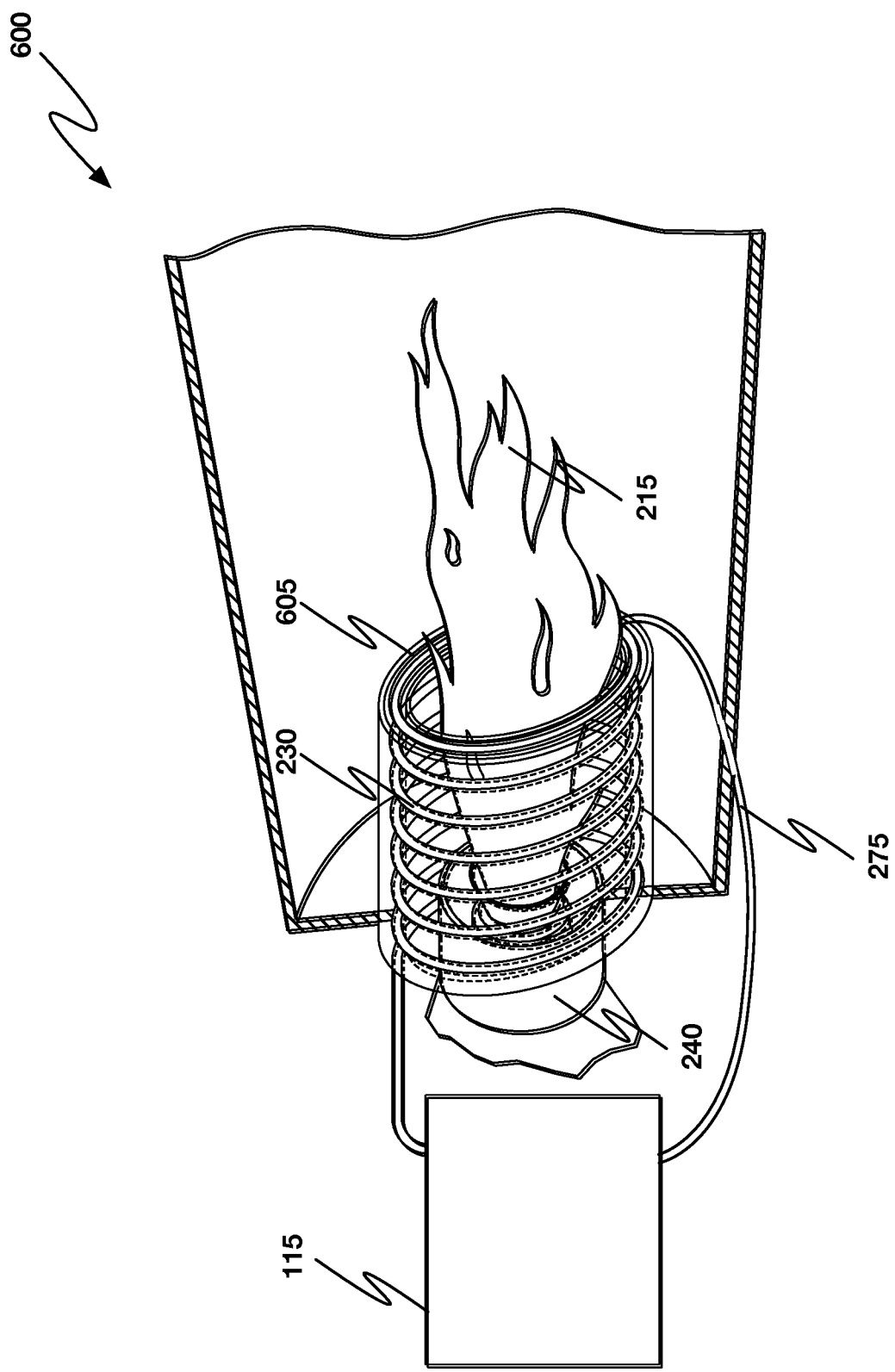
FIG. 6 is a side view of flame heat collector with enclosed tubular heat collection components of the waste heat gathering and transfer system and method of FIG. 1.

Referring now also to FIG. 5 and FIG. 6, in some embodiments of a waste heat gathering and transfer system 500, 600, coil tubes 230, 250 internal to the collectors 135, 605 gather waste heat emitted by the intermittent heat sources 215, 110. The coil tubes 230, 250 can be made of steel, or similar material, and filled with water, or other working fluid. The working fluids flow through the tubes 230, 250, absorbing the heat transferred from the heat collector tubes 230, 250. Other tube configurations besides coils can be used including, for example, helix coils, shell, and tube heat exchangers varying in geometry and configuration to accommodate the energy source and the total thermal input.

In some instances, the working fluid is water and is heated to at least 212° F. Other configurations can use varying temperatures based on the application, working fluid, or both. The working fluid is then circulated in a closed-loop circulation system 275, 505 to an Organic Rankine Cycle power generation facility (ORC) 115 that functions as a heat-to-electricity converter. The ORC system 115 consists of a turbine driven by steam, or other appropriate working fluid, which connects to a generator to produce electricity. The working principle of the ORC system 115 is the same as that of the rankine cycle, where the working fluid heated by the collector 230, 250 where it is then circulated to the ORC generator 115 where the working fluid passing through an expansion device (screw, tubing or similar applicable device), and then passes through a condenser heat exchanger where it is re-condensed to produce electric power.

In some implementations, after the working fluid is used by the ORC system 115 it is recirculated back to the collectors 230, 250 in a closed loop system 275, 505 where it is reheated, recycled and returned. After heat has been extracted from the working fluid to make electric power, it can be used for other secondary purposes 280 to the extent such purposes are included on the closed loop system 275, 505. Uses can include, for example, pre-heating industrial products, removing moisture from industrial products, space heating and other uses related to the facility generating the heat 265.

In some embodiments, electric power produced is transferred to an electricity-to-grid transfer interface 260 using, for example, aluminum wire with a steel core, or other materials with similar properties. The electricity-to-grid transfer interface 260 can be a lithium-ion based energy storage technology or similar battery-based technology. The electricity produced from non-traditional and intermittent heat source 110, 215 can be stored for a relatively even and steady distribution of electric power to one or more power destinations.

In some instances, power from the electricity-to-grid transfer interface 260 is distributed by the electric-to-grid optimizer 285 for distribution to grid destinations, such as the facility generating the heat 265 or an interface compatible power grid 270. The electric-to-grid distribution optimizer 285 can be an integrated relay- and controller-based system for balancing distribution of converted and stored electricity, to, at least in part, assist in maintaining balance and stability of the interfaced power grid, and for use at the facility generating the heat 265 harvested by the collectors.

In some embodiments, the electric-to-grid is distribution optimizer 285 can provide the facility generating intermittent heat 265 with a reliable and steady independent power supply, operating as an independent "microgrid" ("island") or otherwise provide for distribution of power via appropriate connection to and synchronous with the traditional wide area synchronous grid (macrogrid) operated by a central energy supplier. The electric-to-grid optimizer 285 can include a disconnect to "island mode" allowing the facility generating the heat to function autonomously based on, for example, the physical and economic conditions of the facility generating the heat, while allowing unused or excess converted and stored power to be directed via meter toward the grid for credit or sale.

Figure 7:
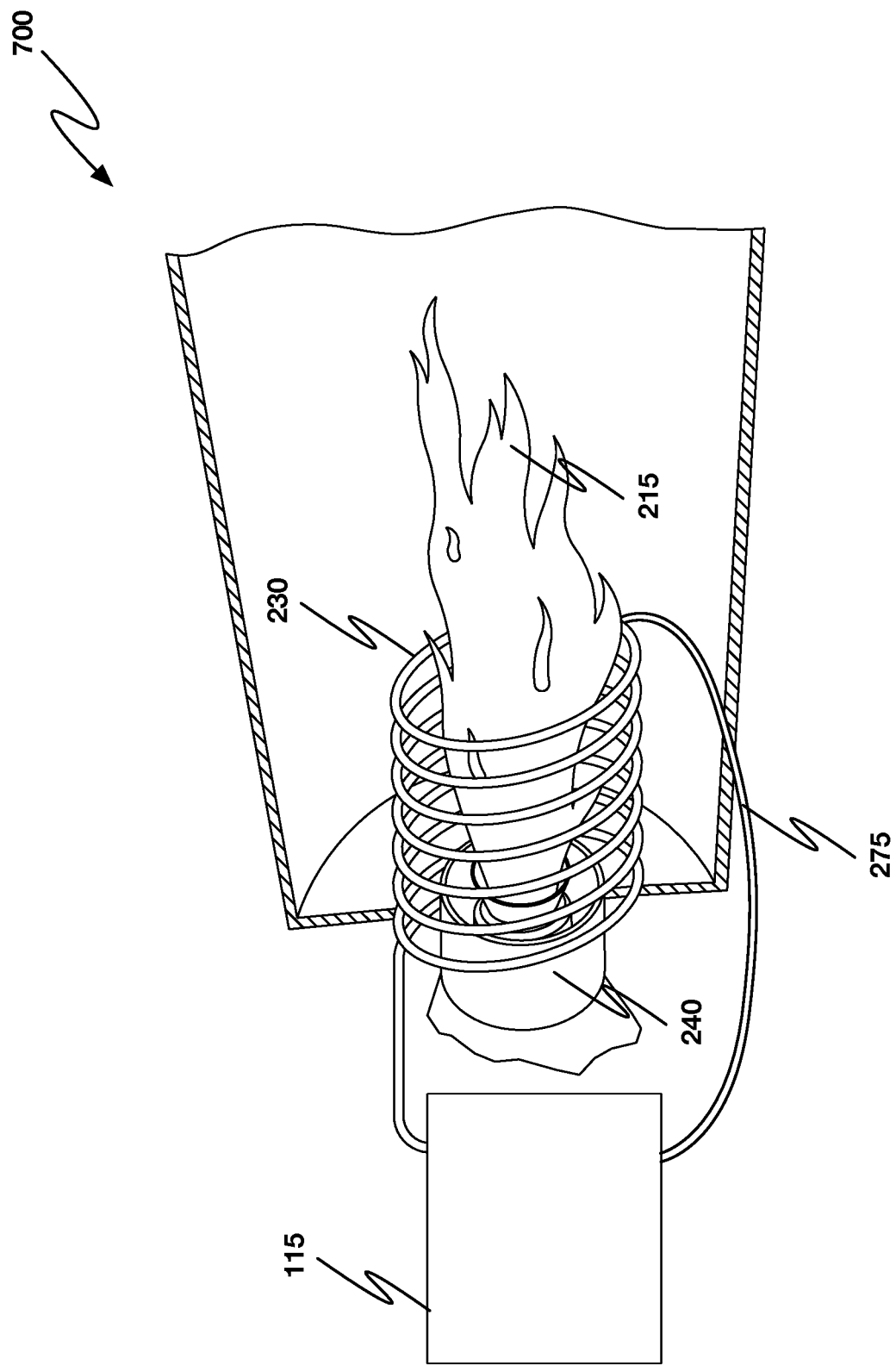
FIG. 7. is a side view of flame collector with exposed tubular heat collection components of the waste heat gathering and transfer system and method of FIG. 1.

Referring now to FIG. 7, in some embodiments of a waste heat gathering and transfer system 700, one or more heat collector components, such as tubes 230, are at least partially exposed to direct heat generated by a burner flame 215.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present systems and methods and their practical applications, to thereby enable others skilled in the art to best utilize the present systems and methods and various embodiments with various modifications as may be suited to the particular use contemplated.

In places where the description above refers to particular implementations of a waste heat gathering and transfer system and method, it should be readily apparent that a number of modifications may be made without departing from the spirit thereof and that these implementations may be applied to other a waste heat gathering systems and assemblies. It will be understood that implementations are not limited to the specific components disclosed herein, as virtually any components consistent with the intended operation of a waste heat gathering and transfer system and method may be utilized. Accordingly, for example, although particular collector components and heat-to-electricity conversion components and the like may be disclosed, such components may comprise any shape, size, style, type, model, version, class, grade, measurement, material, weight, quantity, and/or the like consistent with the intended operation of a method and/or system implementation for a waste heat gathering and transfer system and method.

The accompanying claims are intended to cover such modifications as would fall within the true spirit and scope of the disclosure set forth in this document. The presently disclosed implementations are, therefore, to be considered in all respects as illustrative and not restrictive, the scope of the disclosure being indicated by the appended claims rather than the foregoing description. All changes that come within the meaning of and range of equivalency of the claims are intended to be embraced therein.

Unless otherwise noted, the terms "a" or "an," as used in the specification are to be construed as meaning "at least one of." In addition, for ease of use, the words "including" and "having," as used in the specification, are interchangeable with and have the same meaning as the word "comprising." In addition, the term "based on" as used in the specification is to be construed as meaning "based at least upon."

What is claimed is:

1. A waste heat gathering and transfer system comprising:
a waste heat source generating facility;
a collector operable to collect at least a portion of a facility-generated intermittent waste heat dissipating from one or more equipment surfaces, wherein the one or more equipment surfaces comprises a moving surface;
a heat-to-electricity converter;
an electricity-to-grid transfer interface; and
an electric-to-grid distribution optimizer operable to distribute electricity directly to the waste heat source generating facility.

2. The waste heat gathering and transfer system of claim 1 wherein the electric-to-grid distribution optimizer comprises an integrated relay-based and controller-based system.

3. The waste heat gathering and transfer system of claim 1, wherein the heat-to-electricity converter comprises a semiconductor-based converter.

4. The waste heat gathering and transfer system of claim 1, wherein the heat-to-electricity converter comprises an organic rankine cycle.

5. The waste heat gathering and transfer system of claim 1, further comprising a closed loop system.

6. The waste heat gathering and transfer system of claim 1, wherein the collector comprises one or more tubes.

7. The waste heat gathering and transfer system of claim 6, wherein a working fluid circulates in the one or more tubes.

8. The waste heat gathering and transfer system of claim 7, wherein the working fluid comprises water.

9. The waste heat gathering and transfer system of claim 7, wherein the collector comprises a heat gathering system comprising one or more coils, one or more tubes, and the working fluid.

10. The waste heat gathering and transfer system of claim 1, wherein the one or more equipment surfaces comprises an intermittent heat source.

11. The waste heat gathering and transfer system of claim 1, wherein the one or more equipment surfaces comprise an industrial equipment surface.

12. The waste heat gathering and transfer system of claim 1, wherein the one or more equipment surfaces comprises a residential equipment surface.

13. The waste heat gathering and transfer system of claim 1, wherein the one or more equipment surfaces comprise a commercial equipment surface.

14. The waste heat gathering and transfer system of claim 1, wherein the one or more equipment surfaces is an asphalt plant equipment surface.

15. A waste heat gathering and transfer system collector comprising:
 an external collector layer;
 an external collector layer surface;
 an external collector layer outer surface;
 an internal collector layer that partially encapsulates a waste heat source equipment surface, wherein the waste heat source equipment surface comprises a moving surface;
 an internal collector layer internal surface;
 an internal collector layer external surface;
 an interior gap area between the external collector layer inner surface and the internal collector layer internal surface;
 an insulating material;
 a heat collector component; and
 a heat transfer component.

16. The waste heat gathering and transfer system collector of claim 15 further comprising a support structure.

17. The waste heat gathering and transfer system collector of claim 15, wherein the moving surface comprises a rotating drum dryer surface.

18. The waste heat gathering and transfer system collector of claim 15, wherein a heat collecting component is positioned in the interior gap area between the external collector layer inner surface and the internal collector layer internal surface.

* * * * *